United States Patent
Lin et al.

(10) Patent No.: US 10,998,495 B2
(45) Date of Patent: May 4, 2021

(54) MAGNETOSTRICTIVE STACK AND CORRESPONDING BIT-CELL

(71) Applicant: Intel Corporation, Santa Clara, CA (US)

(72) Inventors: Chia-Ching Lin, West Lafayette, IN (US); Sasikanth Manipatruni, Hillsboro, OR (US); Dmitri E. Nikonov, Beaverton, OR (US); Ian A. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/329,721

(22) PCT Filed: Sep. 30, 2016

(86) PCT No.: PCT/US2016/054666
§ 371 (c)(1),
(2) Date: Feb. 28, 2019

(87) PCT Pub. No.: WO2018/063286
PCT Pub. Date: Apr. 5, 2018

(65) Prior Publication Data
US 2019/0198754 A1    Jun. 27, 2019

(51) Int. Cl.
*H01L 43/10*    (2006.01)
*H01L 41/187*   (2006.01)
(Continued)

(52) U.S. Cl.
CPC ............ *H01L 43/10* (2013.01); *G11C 11/161* (2013.01); *G11C 11/1673* (2013.01);
(Continued)

(58) Field of Classification Search
CPC ......... H01L 43/10; H01L 43/08; H01L 41/00; H01L 27/228; H01L 43/02;
(Continued)

(56) References Cited

U.S. PATENT DOCUMENTS

2009/0067224 A1    3/2009    Hochstrat et al.
2010/0264475 A1    10/2010   Worledge
(Continued)

FOREIGN PATENT DOCUMENTS

WO    2016099515    6/2016

OTHER PUBLICATIONS

Fetisov. Magnetoelectric effect in Multilayer Ferromagnetic-Piezoelectric structures . . . Bulletin of the Russian Academy of Science, Physics, 2007, vol. 71, No. 11, pp. 1626-1628 (Year: 2007).*

(Continued)

*Primary Examiner* — Galina G Yushina
(74) *Attorney, Agent, or Firm* — Green, Howard & Mughal LLP

(57) ABSTRACT

An apparatus is provided which comprises: a ferromagnetic (FM) region with magnetostrictive (MS) property; a piezo-electric (PZe) region adjacent to the FM region; and a magnetoelectric region adjacent to the FM region. An apparatus is provided which comprises: a FM region with MS property; a PZe region adjacent to the FM region; and a magnetoelectric region, wherein the FM region is at least partially adjacent to the magnetoelectric region. An apparatus is provided which comprises: a FM region with MS property; a PZe region adjacent to the FM region; a magnetoelectric region being adjacent to the FM and PZe regions; a first electrode adjacent to the FM and PZe regions; a second electrode adjacent to the magnetoelectric region; a spin orbit coupling (SOC) region adjacent to the magneto- (Continued)

electric region; and a third electrode adjacent to the SOC region.

20 Claims, 10 Drawing Sheets

(51) Int. Cl.
| | |
|---|---|
| H01L 41/193 | (2006.01) |
| H01L 41/20 | (2006.01) |
| G11C 11/16 | (2006.01) |
| H01L 41/00 | (2013.01) |
| H01L 27/22 | (2006.01) |
| H01L 43/08 | (2006.01) |
| H01F 10/32 | (2006.01) |
| H01L 43/02 | (2006.01) |
| H01F 10/12 | (2006.01) |

(52) U.S. Cl.
CPC ...... *G11C 11/1675* (2013.01); *H01F 10/3254* (2013.01); *H01L 27/228* (2013.01); *H01L 41/00* (2013.01); *H01L 41/1871* (2013.01); *H01L 41/1875* (2013.01); *H01L 41/1876* (2013.01); *H01L 41/1878* (2013.01); *H01L 41/193* (2013.01); *H01L 41/20* (2013.01); *H01L 43/02* (2013.01); *H01L 43/08* (2013.01); *H01F 10/123* (2013.01); *H01F 10/126* (2013.01)

(58) Field of Classification Search
CPC .............. H01L 41/1871; H01L 41/1875; H01L 41/1876; H01L 41/1878; H01L 41/193; H01L 41/20; H01F 10/123; H01F 10/126; G11C 11/161; G11C 11/1673; G11C 11/1675

See application file for complete search history.

(56) References Cited

U.S. PATENT DOCUMENTS

| | | | |
|---|---|---|---|
| 2012/0293023 A1* | 11/2012 | Harris .................. | H01P 1/19 310/26 |
| 2013/0163313 A1* | 6/2013 | Tiercelin ............. | G11C 11/1675 365/157 |
| 2014/0125332 A1* | 5/2014 | Lage .................... | G01R 33/18 324/244 |
| 2016/0078912 A1* | 3/2016 | Liu ...................... | G11C 11/1675 365/158 |
| 2016/0225890 A1 | 8/2016 | Datta et al. | |
| 2017/0243917 A1* | 8/2017 | Manipatruni ........ | H03K 19/173 |
| 2017/0352802 A1 | 12/2017 | Nikonov et al. | |

OTHER PUBLICATIONS

Gopal et al. Polarization, piezoelectric constants and elastic constants of ZnO, MgO and CdO, Department of Eneergy, grant DE-FG03-02ER45986, pp. 1-7, 2005 (Year: 2005).*

Fetisov, Magnetoelectric Effect in Multilayer Ferromagnetic-Piezoelectric Structures and Its Application in Electronics. Bulletin of the Russian Academy of Science: Physics, 2007, vol. 71, pp. 1626-1628 (Year: 2007).*

International Preliminary Report on Patentability dated Apr. 11, 2019 for PCT Patent Application No. PCT/US16/54666.

International Search Report and Written Opinion for International Patent Application No. PCT/US2016/054666, dated Apr. 25, 2017.

* cited by examiner

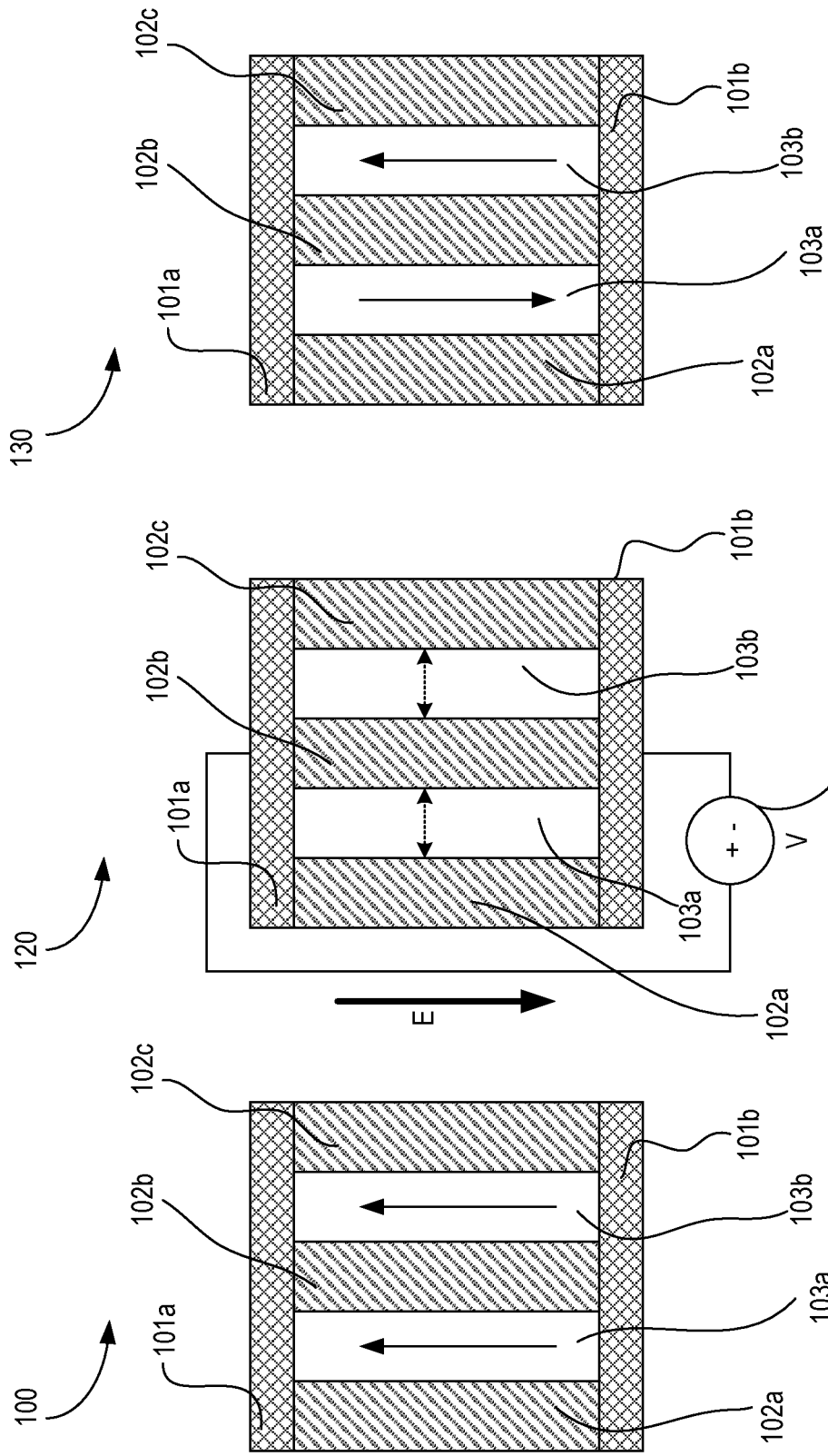

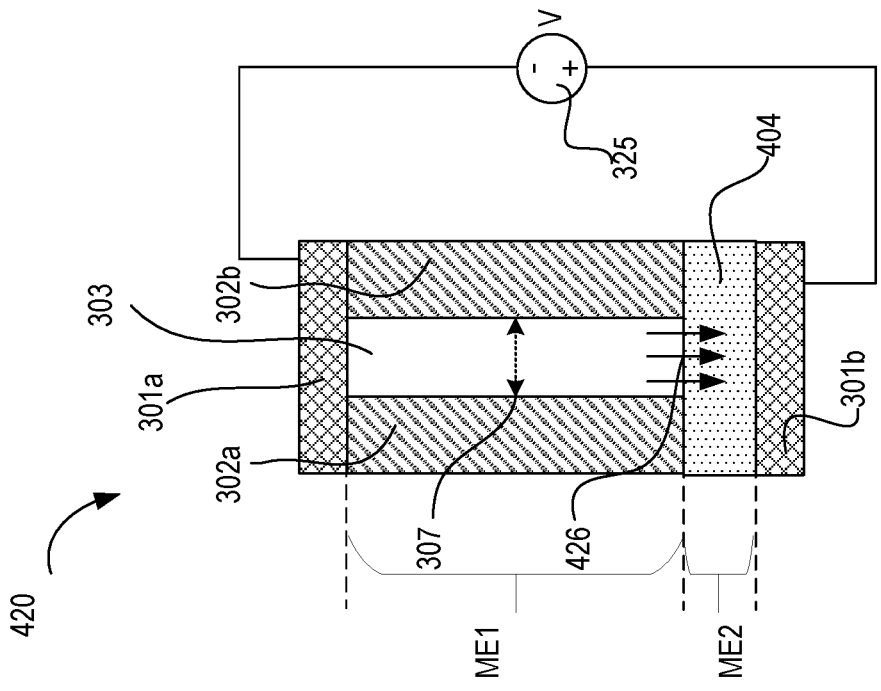
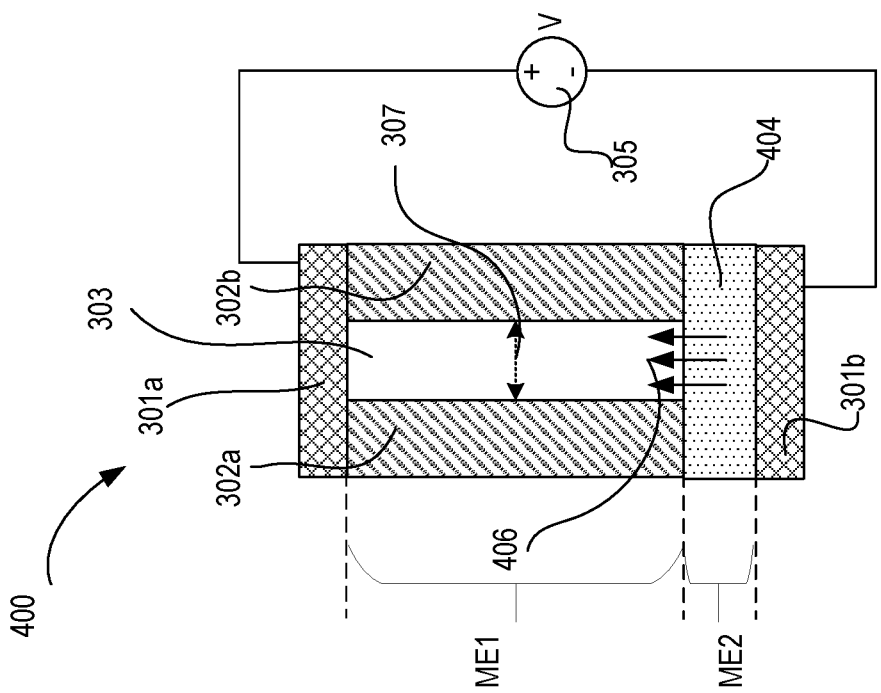
Fig. 4B
Fig. 4A

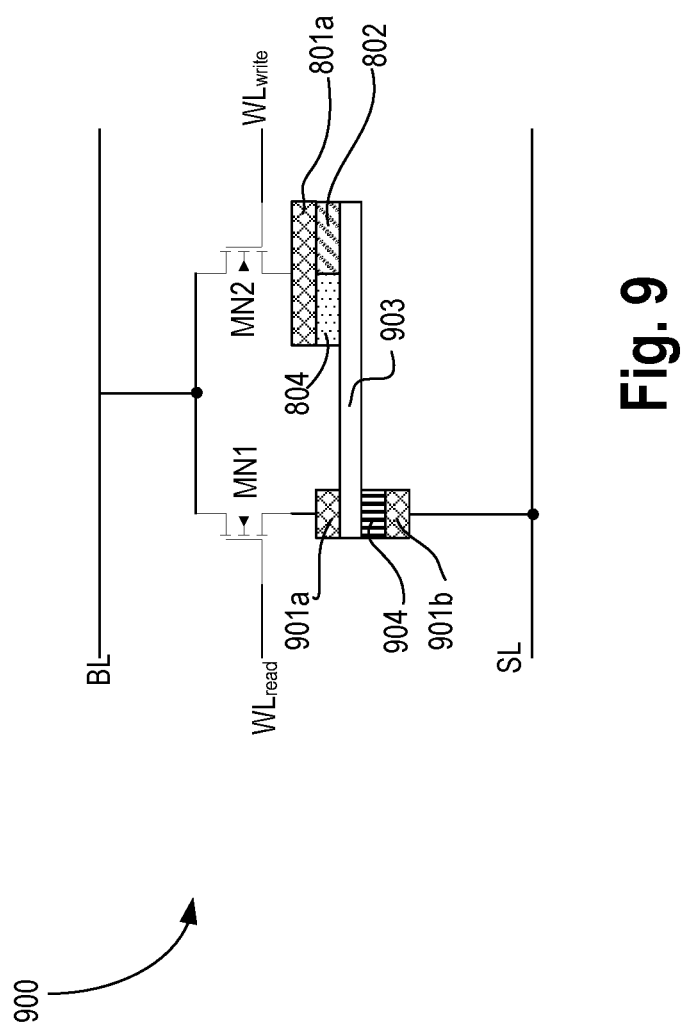

MAGNETOSTRICTIVE STACK AND CORRESPONDING BIT-CELL

CLAIM OF PRIORITY

This Application is a National Stage Entry of, and claims priority to, PCT Application No. PCT/US2016/054666, filed on Sep. 30, 2016 and titled "MAGNETOSTRICTIVE STACK AND CORRESPONDING BIT-CELL", which is incorporated by reference in its entirety for all purposes.

BACKGROUND

Spintronics is the study of intrinsic spin of the electron and its associated magnetic moment in solid-state devices. Spintronic logic are integrated circuit devices that use a physical variable of magnetization or spin as a computation variable. Such variables can be non-volatile (i.e., preserving a computation state when the power to an integrated circuit is switched off). Non-volatile logic can improve the power and computational efficiency by allowing architects to put a processor to un-powered sleep states more often and therefore reduce energy consumption. Existing spintronic logic generally suffer from high energy and relatively long switching times.

For example, large write current (e.g., greater than 100 nA) and voltage (e.g., greater than 0.7V) are needed to switch a magnet (i.e., to write data to the magnet) in Magnetic Tunnel Junctions (MTJs). Existing Magnetic Random Access Memory (MRAM) based on MTJs also suffer from high write error rates (WERs) or low speed switching. For example, to achieve lower WERs, switching time is slowed down which degrades the performance of the MRAM. MTJ based MRAMs also suffer from reliability issues due to tunneling current in the spin filtering tunneling dielectric of the MTJs e.g., magnesium oxide (MgO).

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 1A illustrates a two-phase nanopillar structure with magnetization directions of the magnetostrictive (MS) layer preset to the up direction.

FIG. 1B illustrates the two-phase nanopillar structure of FIG. 1A after an electric field is applied across it resulting in the magnetization directions of the MS layer along its hard-axis (horizontally left or right).

FIG. 1C illustrates the two-phase nanopillar structure of FIG. 1B after the electric field is removed resulting in the magnetization directions of the MS layer to have random directions along its easy-axis (e.g., 50% up and 50% down).

FIG. 4A illustrates a nanopillar structure with a deterministic MS stack with a positive voltage applied across it, according to some embodiments of the disclosure.

FIG. 4B illustrates a nanopillar structure with a deterministic MS stack with a negative voltage applied across it, according to some embodiments of the disclosure.

FIG. 9 illustrates a memory bit cell comprising a laminate structure with a deterministic MS stack, according to some embodiments of the disclosure.

DETAILED DESCRIPTION

Figure 2C:
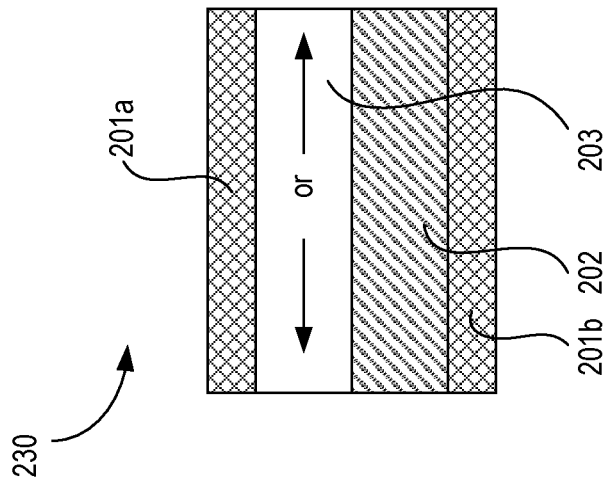
FIG. 2C illustrates the two-phase laminate structure of FIG. 2B with magnetization of the MS layer pointing to random directions along the easy-axis (e.g., 50% right and 50% left) after the electric field is removed.

The Magneto-electric (ME) effect has the ability to manipulate the magnetization by an applied electric field. Since an estimated energy dissipation per unit area per magnet switching event through the ME effect is an order of magnitude smaller than with spin-transfer torque (STT) effect, ME materials have the capability for next-generation memory and logic applications. One of the most promising approaches to perform the ME effect at room temperature is adopting two-phase ME materials to control the magnetization with an electric field via strain, where one phase is a piezoelectric (PZe) material and the other phase is a magnetostrictive (MS) material, and they are formed as laminate or nanopillar structures. Strain induced by electric field in the PZe material can control the magnetization in the MS material. However, up to date (currently the state of the art for the control of magnetism), strain can control the magnetization to one particular direction, but it cannot control the magnetization to two stable directions which is the basic requirement for current bi-state memory and logic application.

Various embodiments describe a deterministic magnetostrictive stack with various applications such as in logic and memory. In some embodiments, the stack in ME-memory and logic devices allows for manipulating the magnetization to two stable directions. In some embodiments, the stack in ME-memory has potential to lower the critical electric field for switching the magnetization. In some embodiments, the magnetostrictive stack comprises a two-phase ME material (ME1) in contact with another single-phase ME material (ME2). In some embodiments, when an electric field is applied across the magnetostrictive stack, ME1 directs the magnetization to a hard-axis and ME2 becomes a trigger to control the magnetization to either one of the two-stable easy-axis directions desired for bi-state memory and logic applications. As such, the magnetostrictive stack of various embodiments can control the magnetization to two-stable directions. The magnetostrictive stack is used to implement ME-memory and logic devices, according to some embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

FIG. 1A illustrates a two-phase nanopillar structure 100 with magnetization directions of the magnetostrictive (MS) layer preset to the up direction (the easy i.e., low energy, +y axis). Here, two-phase nanopillar structure 100 consists of top electrode 101a, bottom electrode 101b, PZe layer 102a, MS layer 103a, PZe layer 102b, MS layer 103b and PZe layer 102c coupled together as shown. The arrows in the MS layers are the preset magnetization directions. FIG. 1B illustrates a two-phase nanopillar structure 120 of FIG. 1A after an electric field 'E' is applied across it resulting in the magnetization directions of the MS layers 103a and 103b along its hard (i.e., higher-energy) x-axis (left or right). The hard-axis is shown by the dotted horizontal bi-directional arrows. Here, electric field 'E' is applied via a voltage source 104 such that electrode 101a has a positive potential while electrode 101b has a negative potential.

The application of the electric field 'E' may result in strain in layers 102a, 102b, and 102c, which may induce stress in the MS layers 103a and 103b and may change the magnetocrystalline anisotropy in such a way as to decrease the energy of the configuration of magnetization pointing along the x-axis. So effectively, a hard axis becomes an easy axis temporarily, and causes magnetization to point along the +/−x-axis. FIG. 1C illustrates a two-phase nanopillar structure 130 of FIG. 1B after the electric field 'E' is removed resulting in the magnetization directions of MS layers 103a and 103b to reach random directions along its easy-axis (e.g., with probabilities of 50% up and 50% down). The random directions means that such a structure is not suitable for holding data because the magnetizations are not deterministic. The same problem can be shown in a two-phase laminate structure.

Figure 2B:
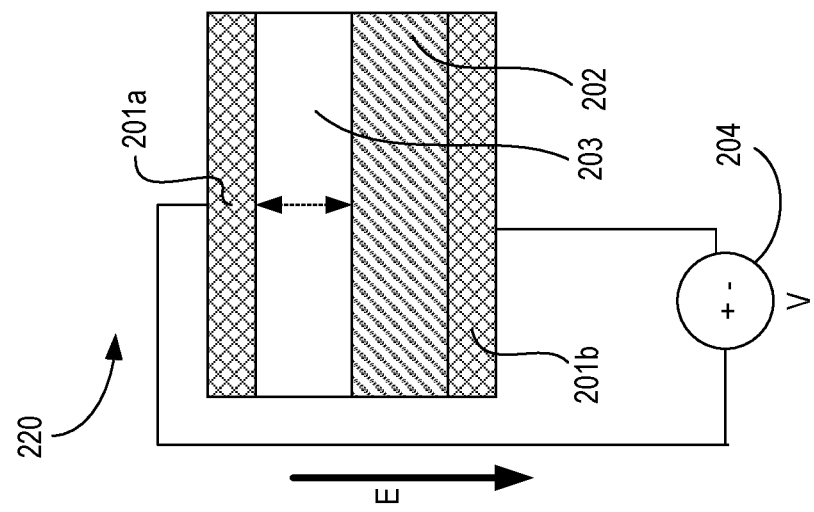
FIG. 2B illustrates the two-phase laminate structure of FIG. 2A with magnetization of the MS layer pointing to the hard-axis directions (e.g., up or down) after an electric field is applied across it.
Figure 2A:
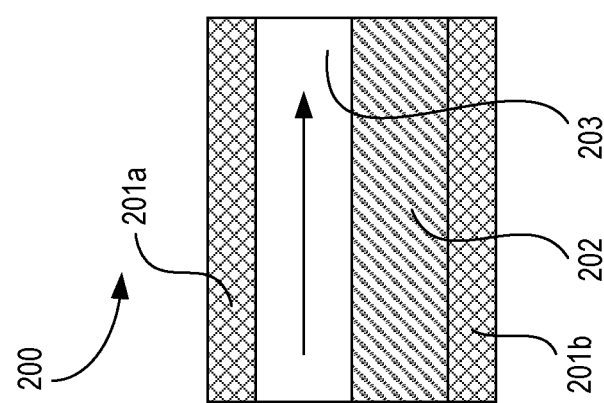
FIG. 2A illustrates a two-phase laminate structure with magnetization of the MS layer preset to the right (horizontal) direction.

FIG. 2A illustrates a two-phase laminate structure 200 with magnetization of a MS layer preset to the right (+x) direction of the easy x-axis. Here, two-phase laminate structure 200 consists of top electrode 201a, bottom electrode 201b, PZe layer 202, and MS layer 203 coupled together as shown. The arrows in MS layer 203 is the preset magnetization direction. In this example, the magnetization direction is in the +x-direction. FIG. 2B illustrates a two-phase laminate structure 220 of FIG. 2A with magnetization of the MS layer pointing to the hard-axis directions (e.g., up or down, +y or −y-axis), but which is now an easy axis due to the applied strain from the PZe material layer 202, after an electric field 'E' is applied across it. Here, electric field 'E' is applied via a voltage source 204 such that electrode 201a has a positive potential while electrode 201b has a negative potential. FIG. 2C illustrates a two-phase laminate structure 230 of FIG. 2B with magnetization of the MS layer pointing to the easy-axis directions (e.g., with probabilities of 50% right and 50% left) after the electric field is removed.

The random directions means that such a structure is not suitable for holding data because the magnetizations are not deterministic.

Figure 3A:
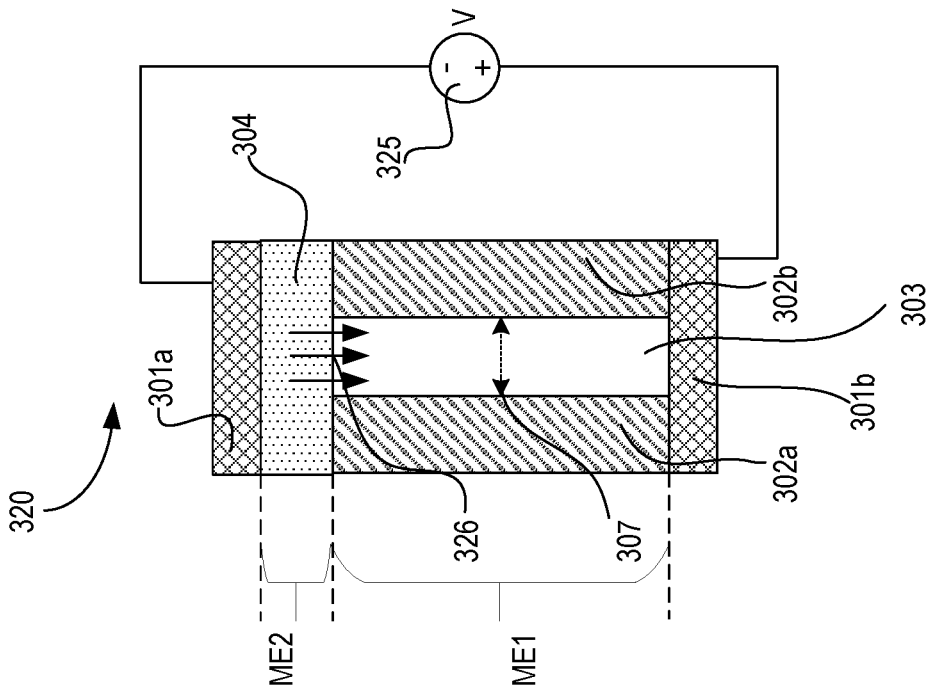
FIG. 3A illustrates a nanopillar structure with a deterministic MS stack with a positive voltage applied across it, according to some embodiments of the disclosure.

FIG. 3A illustrates nanopillar structure 300 with a deterministic MS stack with a positive voltage applied across it, according to some embodiments of the disclosure. In some embodiments, nanopillar structure 300 comprises a two-phase ME material or ME insulator (ME1), a single-phase ME material or ME insulator (ME2) 304, first electrode 301a, and second electrode 301b. In some embodiments, ME1 comprises a first PZe layer 302a (or region), a ferromagnet 303 with MS property, and a second PZe layer 302b (or region) such that ferromagnet 303 with MS property is sandwiched between first PZe layer 302a and second PZe layer 302b. In some embodiments, second electrode 301b is adjacent to and couples with ME1.

In some embodiments, ME2 layer 304 comprises a magnetoelectric material which exerts exchange bias 306 on the adjacent FM layer 303. The exchange bias or an equivalent force possesses a definite direction (rather than merely an axis) and ensures that magnetization in FM layer 303 is aligned along 306. In some embodiments, ME2 layer 304 is formed above ME1 layer such that it is adjacent to first PZe layer 302a (or region), ferromagnet 303 with MS property, and second PZe layer 302b (or region). In some embodiments, first electrode 301a is adjacent to and couples with ME2 layer 304.

In some embodiments, FM 303 with MS property comprises a material selected from a group consisting of: Terfenol-D ($Tb_xDy_{1-x}Fe_2$); $Fe_{1-x}Ga_x$; CoFe; Co; $CoFe_2O_4$; $CoFeO_3$; CoPd; CoFeB; $NiFe_2O_4$; and FeRh. In some embodiments, single-phase ME2 layer 304 comprises a material selected from a group consisting of: BFO (e.g., $BiFeO_3$) and $Cr_2O_3$, or any other material which can exert voltage-switchable exchange bias at its surface. In some embodiments, FM layer 303 comprises a multi-layered perpendicular (e.g., vertical or up/down direction) magnetic material (PMA) stack of materials. For example, FM layer 303 comprises a vertical stack such as layers of Cobalt and Platinum (i.e., Co/Pt). Other examples of the multiple layers include: Co/Pd; Co/Ni; MgO/CoFeB/Ta/CoFeB/MgO; MgO/CoFeB/W/CoFeB/MgO; MgO/CoFeB/V/CoFeB/MgO; MgO/CoFeB/Mo/CoFeB/MgO; $Mn_xGa_y$; Materials with $L1_0$ crystal symmetry; or materials with tetragonal crystal structure, where $L1_0$ is a type of crystal class which exhibits perpendicular magnetizations. Here, '/' between materials indicates a boundary of a material in the stack.

$L1_0$ is a crystallographic derivative structure of a FCC (Face Centered Cubic crystal) structure and has two of the faces occupied by one type of atom and the corner, and the other face occupied with the second type of atom. When phases with the $L1_0$ structure are ferromagnetic, the magnetization vector usually is along the [0 0 1] axis of the crystal. Examples of materials with $L1_0$ symmetry include CoPt and FePt. Examples of materials with tetragonal crystal structure and magnetic moment are Heusler alloys such as CoFeAl, MnGe, MnGeGa, and MnGa.

In some embodiments, first and second PZe layers 302a and 302b, respectively, comprise a material selected from a group consisting of: $Pb(Zr_{0.2}Ti_{0.8})O_3$; $PbTiO_3$; $BaTiO_3$; $BiFeO_3$; $Bi_4Ti_3O_{12}$; Polyvinylidene fluoride; PZT; and PMNPT. In other embodiments, other materials may be used for forming PZe layers 302a and 302b. For example, materials such as PZT-5, PZT-4, PZNPT, PVDF can be used for forming PZe layers 302a and 302b.

In some embodiments, electrodes 301a and 301b comprises non-magnetic conductive metals such as graphene, Cu, Ag, and Au. In some embodiments, the material growth of nanopillar structure 300 with deterministic MS stack can be realized by one or more of: sputtering deposition system, pulsed laser deposition (PLD), chemical vapor deposition system (CVD) and molecular beam epitaxy (MBE).

In some embodiments, a voltage source 305 is provided to exert strain on the MS stack. In some embodiments, the voltage source 305 applies one of a "+V" or $+V_{strain}$ voltage, or "–V" or $-V_{strain}$ voltage, or no voltage across electrodes 301a/b. In some embodiments, PZe layers 302a and 302b are operable to exert strain on FM 303 in response to voltage 'V' or $V_{strain}$ applied across PZe layers 302a and 302b via electrodes 301a/b. The range of voltage $V_{strain}$ is in the range of 30 mV to 300 mV, in accordance with some embodiments.

In this example, the positive terminal of voltage source 305 is coupled to first electrode 301a while the negative terminal of voltage source 305 is coupled to second electrode 301b. In some embodiments, with an applied voltage 'V' (or electric field 'E'), the magnetization 307 tends to point to hard-axis directions due to the combination of piezoelectric and magnetostrictive effects, which temporarily make a hard-axis 'x' to be an easy (e.g., lower energy) axis. At the same time, the exchange bias 306 from ME2 layer 304 guides the magnetization of MS material 303. Thus, the net magnetization in this stack points to the two-stable easy-axis directions with an applied voltage 'V', according to some embodiments. By controlling the polarity of voltage, the magnetization of FM layer 303 can be controlled, according to some embodiments.

Figure 3B:
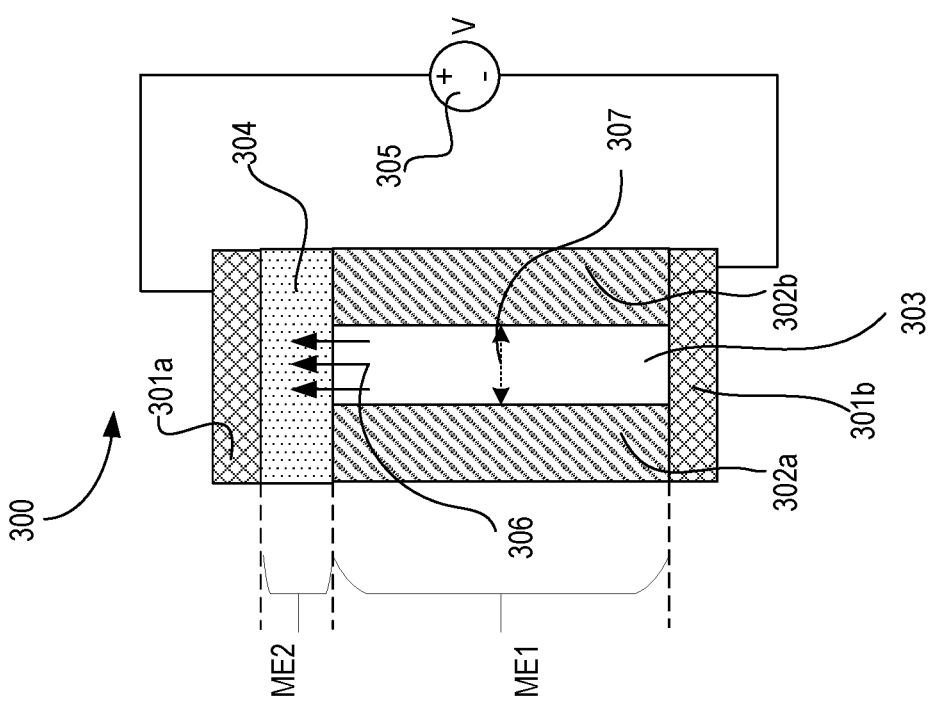
FIG. 3B illustrates a nanopillar structure with a deterministic MS stack with a negative voltage applied across it, according to some embodiments of the disclosure.

FIG. 3B illustrates nanopillar structure 320 with a deterministic MS stack with a negative voltage applied across it, according to some embodiments of the disclosure. It is pointed out that those elements of FIG. 3B having the same reference numbers (or names) as the elements of any other figure can operate or function in any manner similar to that described, but are not limited to such. Nanopillar structure 320 is similar to nanopillar structure 300 but for reverse in applied voltage 'V'. Here, voltage source 325 is coupled to nanopillar structure 320 such that a negative potential is applied to interconnect 301a and a positive potential is applied to interconnect 301b. The magnetization induced by switched exchange bias 326 is opposite in polarity than the magnetization induced by the previous exchange bias 306. As such, the net magnetization in this stack points to the other of the two-stable easy-axis directions (compared to that of FIG. 3A) with an applied voltage 'V', according to some embodiments.

FIG. 4A illustrates nanopillar structure 400 with a deterministic MS stack with a positive voltage applied across it, according to some embodiments of the disclosure. It is pointed out that those elements of FIG. 4A having the same reference numbers (or names) as the elements of any other figure can operate or function in any manner similar to that described, but are not limited to such. Nanopillar structure 400 is similar to nanopillar structure 300 but for the position of the single-phase ME2 layer. In some embodiments, ME2 layer can be formed at the bottom of the nanopillar. One such embodiment is illustrated in nanopillar structure 400. Here, ME2 layer 404 is adjacent to ME1 and second electrode 301b. Operation wise, nanopillar structure 400 behaves similar to nanopillar structure 320 where a negative potential is applied to second electrode 301b and a positive potential is applied to first electrode 301a.

FIG. 4B illustrates nanopillar structure 420 with a deterministic MS stack with a negative voltage applied across it, according to some embodiments of the disclosure. It is pointed out that those elements of FIG. 4B having the same reference numbers (or names) as the elements of any other figure can operate or function in any manner similar to that described, but are not limited to such. Nanopillar structure 420 is similar to nanopillar structure 400 but for the polarity of application of voltage 'V' across first and second electrodes 301a/b. In some embodiments, ME2 layer can be formed at the bottom of the nanopillar. One such embodiment is illustrated in nanopillar structure 420. Here, ME2 404 layer is adjacent to ME1 and second electrode 301b. Operation wise, nanopillar structure 420 behaves similar to nanopillar structure 300 where a negative potential is applied to first electrode 301a and a positive potential is applied to second electrode 301b.

While the PZe layers 302a/b are described as first and second layers, the PZe layers 302a/b can be a single layer surrounding all ferromagnet pillars, in accordance with some embodiments.

Figure 5:
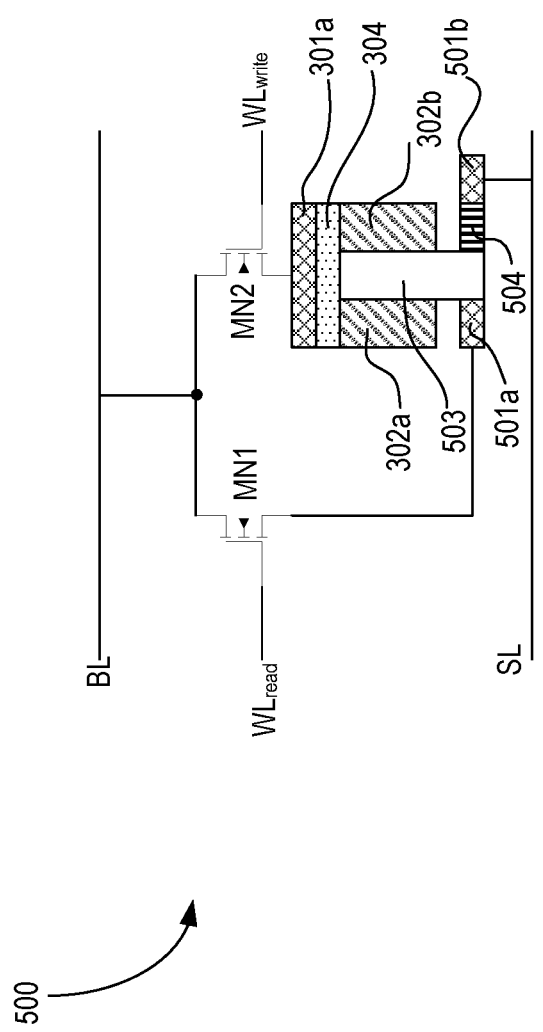
FIG. 5 illustrates a memory bit cell comprising a nanopillar structure with a deterministic MS stack, according to some embodiments of the disclosure.

FIG. 5 illustrates a memory bit cell 500 comprising a nanopillar structure with a deterministic MS stack, according to some embodiments of the disclosure. It is pointed out that those elements of FIG. 5 having the same reference numbers (or names) as the elements of any other figure can operate or function in any manner similar to that described, but are not limited to such.

Bit cell 500 comprises bit line (BL), source line or select line (SL), read word line ($WL_{read}$), write word line ($WL_{write}$), first n-type transistor MN1, second n-type transistor MN2, nanopillar structure with deterministic stack coupled to transistor MN2, transistor MN1, and SL. In some embodiments, BL is coupled to drain/source terminal of transistors MN1 and MN2. In some embodiments, source/drain terminal of transistor MN2 is coupled to first electrode 301a. Compared to the nanopillar structure 300 of FIG. 3A, here ferromagnet (FM) layer 303 is extended as shown by FM layer 503. Here, FM layer 503 has the same material composition as FM layer 303. In some embodiments, a second electrode 501a (e.g., formed of same material as electrode 301a) is formed adjacent to FM layer 503 such that second electrode 501a is coupled to source/drain of first transistor MN1. In some embodiments, a spin orbit coupling (SOC) material 504 (e.g., material exhibiting inverse spin orbit coupling) is formed adjacent to FM layer 503. In some embodiments, third electrode 501b is formed adjacent to SOC material 504 such that third electrode 501b is coupled to the SL. Third electrode 501b may be formed of the same material as electrode 301a. In some embodiments, SOC material comprises a material selected from a group consisting of: β-Ta, β-W, W, Pt, Cu doped with Iridium, Cu doped with Bismuth, and Cu doped an element of 3d, 4d, 5d, 4f, or 5f of periodic table groups.

In some embodiments, bit cell 500 is selected from among other bit cells in a memory array (not shown) by activating a particular BL and a word line (e.g., one of $WL_{read}$ or $WL_{write}$). The read and write operations can be performed in the manner described below, but not limited to the particular sequence.

During read operation, the first transistor MN1 is turned on. As such transistor MN1 electrically couples to BL. Transistor MN1 is turned on by activating $WL_{read}$ (e.g., setting $WL_{read}$ to a logic '1'). During read operation, the second transistor MN2 is turned off. As such transistor MN2 electrically de-couples from BL. Transistor MN2 is turned off by de-activating $WL_{write}$ (i.e., setting $WL_{write}$ to a logic '0'). A read current is applied to FM layer 503 via the turned on transistor MN1 and through BL. In some embodiments, the read current is applied as a pulse having a pulse width and/or height. In some embodiments, SL is coupled to ground during read operation. The current passing through the ferromagnetic element 503 is spin polarized, in accordance with some embodiments. In some embodiments, spin polarized current exiting FM layer 503 is converted to charge current $I_{charge}$ due to the nature of transport across inverse spin orbit coupling (ISOC) layer 504. The charge current $I_{charge}$ is collected on SL. A sense amplifier (not shown) determines the state stored in the memory bit-cell according to the direction of the charge current $I_{charge}$. For example, if the direction of the charge current $I_{charge}$ is away from the bit-cell then the logic stored is logic '0,' otherwise the logic stored is logic '1.'

During write operation, the first transistor MN1 is turned off. As such transistor MN1 electrically de-couples from BL. Transistor MN1 is turned off by de-activating $WL_{read}$ (e.g., setting $WL_{read}$ to a logic '0'). During write operation, the second transistor MN2 is turned on. As such transistor MN2 electrically couples to BL. Transistor MN2 is turned on by activating $WL_{write}$ (e.g., setting $WL_{write}$ to a logic '1'). Voltage applied across layers 301a and 501b switches the magnetization in layer 503. In some embodiments, layer 302a/302b modifies the magnetic anisotropy of layer 503 and causes it to deflect to +/−x axis. In some embodiments, layer 304 exerts exchange bias in the +y or −y direction and sets a definite direction of magnetization in layer 503 after switching. In some embodiments, positive voltage at BL switches magnetization in layer 503 along the +y axis, and negative voltage at BL switches magnetization in layer 503 along the −y axis.

Figure 6A:
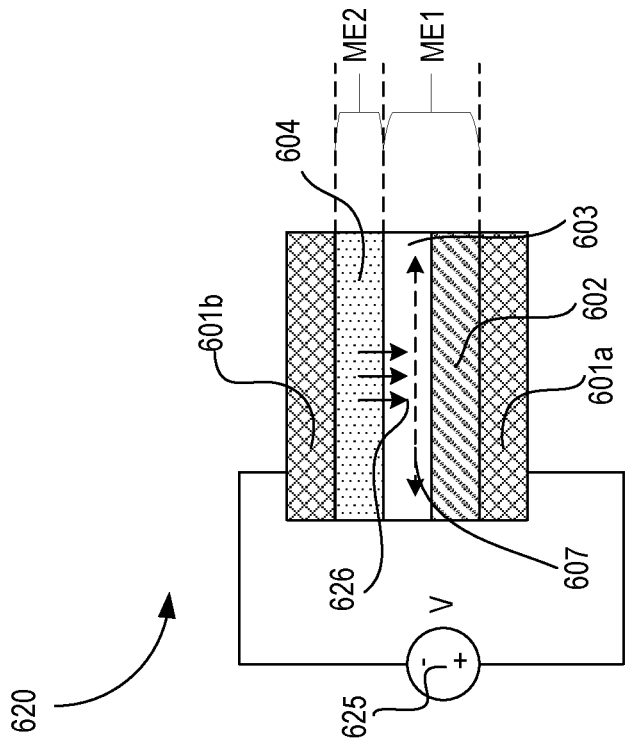
FIG. 6A illustrates a laminate structure with a deterministic MS stack with a positive voltage applied across it, according to some embodiments of the disclosure.

FIG. 6A illustrates laminate structure 600 with a deterministic MS stack with a positive voltage applied across it, according to some embodiments of the disclosure. In some embodiments, laminate structure 600 is formed by sandwiching ME1 and ME2 layers between first and second electrodes 601a and 601b. In some embodiments, ME1 comprises PZe layer 602 and FM layer 603 with MS property, where PZe layer 602 is coupled to first electrode 601a while FM layer 603 is coupled to a ME2 material (or ME2 layer 604). In some embodiments, ME2 layer 604 is coupled to second electrode 601b. The materials for PZe layer 602 can be any of the materials discussed with reference to PZe layers 302a/b. The materials FM layer 603 can be any of the materials discussed with reference to FM layer 303. The materials of ME layer 604 can be one of the materials discussed with reference to ME2 layer 304. The materials for first and second electrodes 601a/b can be any of the materials discussed with reference to first and second electrodes 301a/b. In some embodiments, the material growth of laminate structure 600 with deterministic MS stack can be realized by one or more of: sputtering deposition system, PLD, CVD, and MBE.

In some embodiments, voltage source 605 is provided which is coupled to first and second electrodes such that a negative potential is applied to first electrode 601a and a positive potential is applied to second electrode 601b. In some embodiments, with an applied voltage 'V' (or electric field 'E'), the magnetization 607 tends to point to hard-axis directions due to the combination of piezoelectric and magnetostrictive effects. At the same time, the exchange bias 606 from ME2 layer 604 guides the magnetization of MS material 603. Thus, the net magnetization in this stack will point to the two stable easy-axis directions with an applied voltage 'V', according to some embodiments. By controlling the polarity of voltage, the magnetization of FM layer 603 can be controlled, according to some embodiments.

Figure 6B:
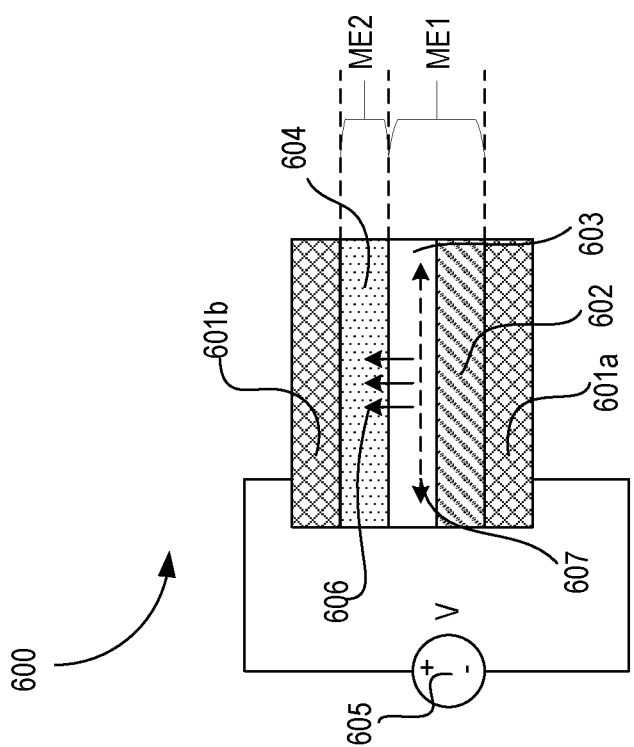
FIG. 6B illustrates a laminate structure with a deterministic MS stack with a negative voltage applied across it, according to some embodiments of the disclosure.

FIG. 6B illustrates laminate structure 620 with a deterministic MS stack with a negative voltage applied across it, according to some embodiments of the disclosure. It is pointed out that those elements of FIG. 6B having the same reference numbers (or names) as the elements of any other figure can operate or function in any manner similar to that described, but are not limited to such. Laminate structure 620 is similar to laminate structure 600 but for reverse in applied voltage 'V'. Here, voltage source 625 is coupled to laminate structure 620 such that a negative potential is applied to electrode 601b and a positive potential is applied to interconnect 601a. The magnetization induced by switched exchange bias 626 is opposite in polarity than the magnetization induced by previous exchange bias 606. As such, the net magnetization in this stack will point to the other of the two stable easy-axis directions (compared to that of FIG. 6A) with an applied voltage 'V', according to some embodiments.

Figure 7A:
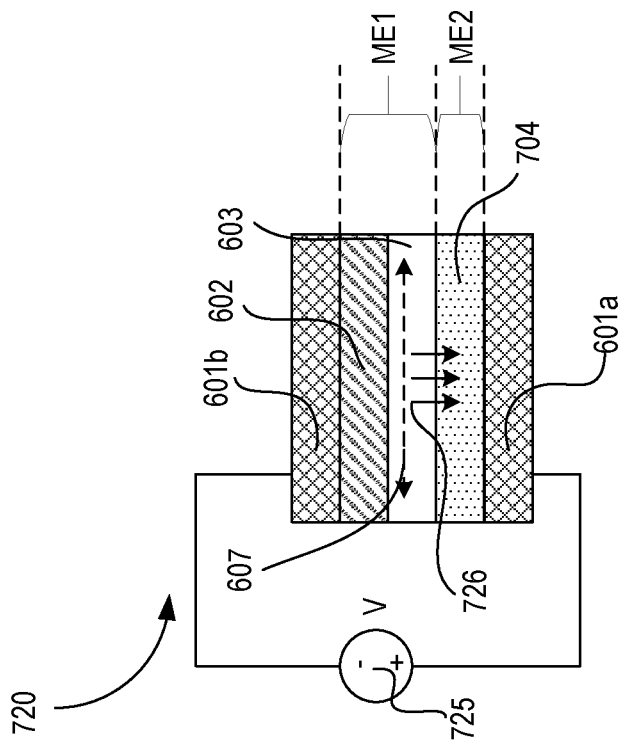
FIG. 7A illustrates a laminate structure with a deterministic MS stack with a positive voltage applied across it, according to some embodiments of the disclosure.

FIG. 7A illustrates laminate structure 700 with a deterministic MS stack with a positive voltage applied across it, according to some embodiments of the disclosure. It is pointed out that those elements of FIG. 7A having the same reference numbers (or names) as the elements of any other figure can operate or function in any manner similar to that described, but are not limited to such. Laminate structure 700 is similar to laminate structure 600 but for the position of ME2. In some embodiments, ME2 layer 704 can be formed at the bottom of the laminate structure. One such embodiment is illustrated in laminate structure 700. Here, ME2 layer 704 is adjacent to ME1 and first electrode 601a. Here, positive terminal of voltage source 705 is coupled to electrode 601b while the negative terminal of voltage source 705 is coupled to electrode 601a. Operation wise, laminate structure 700 behaves similar to laminate structure 620 where a negative potential is applied to second electrode 601b and positive potential is applied to first electrode 601a.

Figure 7B:
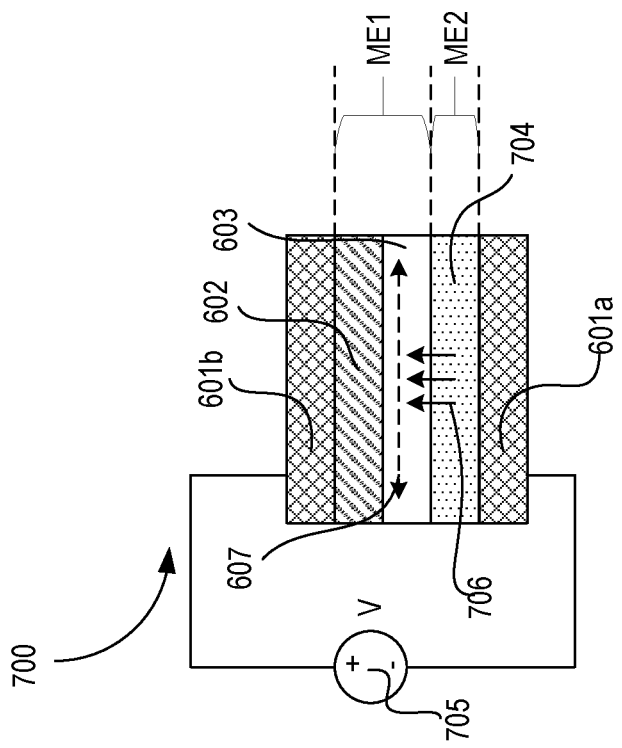
FIG. 7B illustrates a laminate structure with a deterministic MS stack with a negative voltage applied across it, according to some embodiments of the disclosure.

FIG. 7B illustrates laminate structure 720 with a deterministic MS stack with a negative voltage applied across it, according to some embodiments of the disclosure. It is pointed out that those elements of FIG. 7B having the same reference numbers (or names) as the elements of any other figure can operate or function in any manner similar to that described, but are not limited to such. Laminate structure 720 is similar to laminate structure 700 but for reverse in applied voltage 'V'. Here, voltage source 725 is coupled to laminate structure 720 such that a negative potential is applied to electrode 601b and a positive potential is applied to interconnect 601a. The magnetization induced by switched exchange bias 726 is opposite in polarity than the magnetization induced by previous exchange bias 706. As such, the net magnetization in this stack will point to the other of the two-stable easy-axis directions (compared to that of FIG. 7A) with an applied voltage 'V', according to some embodiments.

Figure 8A:
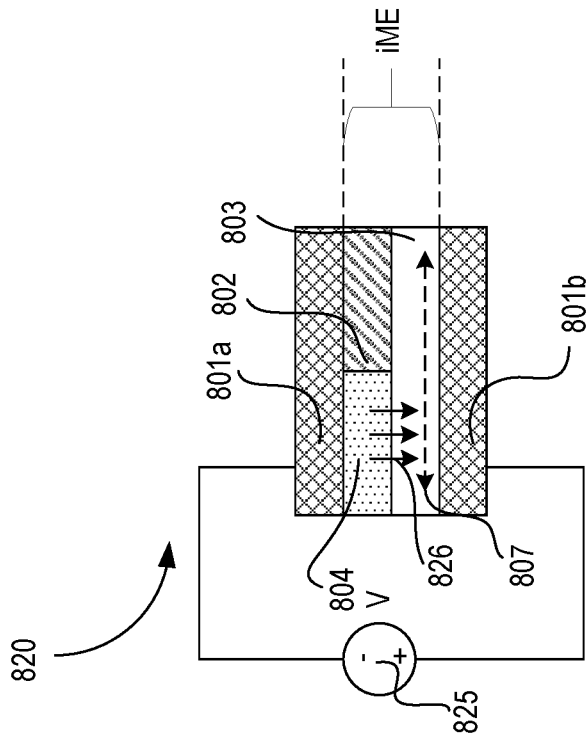
FIG. 8A illustrates a laminate structure with a deterministic MS stack with a positive voltage applied across it, according to some embodiments of the disclosure.

FIG. 8A illustrates laminate structure 800 with a deterministic MS stack with a positive voltage applied across it, according to some embodiments of the disclosure. It is pointed out that those elements of FIG. 8A having the same reference numbers (or names) as the elements of any other figure can operate or function in any manner similar to that described, but are not limited to such.

In some embodiments, laminate structure 800 is formed by integrating ME1 and ME2 layers between first and second electrodes 801a and 801b. The integrated ME1 and ME2 is referred to as iME. In some embodiments, iME comprises PZe layer 802, first FM layer 803 with MS property, and ME2 layer 804. In some embodiments, both PZe layer 802 and ME2 layer 804 are coupled to first electrode 801a. In some embodiments, PZe layer 802 and ME2 layer 804 are formed on the same layer which is above or below the first FM layer 803. While the embodiments illustrate an evenly divided region for PZe layer 802 and ME2 layer 804 over first FM layer 803, any proportion for regions of PZe layer 802 and ME2 layer 804 may be used. For example, PZe layer 802 may occupy one-third of the area over FM layer 803 while ME2 layer 804 may occupy two-thirds of the area over FM layer 803.

In some embodiments, first FM layer 803 is coupled to second electrode 801b. The materials for PZe layer 802 can be any of the materials discussed with reference to PZe layers 302a/b. The materials FM layer 803 can be any of the materials discussed with reference to FM layer 303. The materials of iME layer 804 can be can be of the materials discussed with reference to ME2 layer 304. The materials for first and second electrodes 801a/b can be any of the materials discussed with reference to first and second electrodes 301a/b.

In some embodiments, voltage source 805 is provided which is coupled to first and second electrodes such that a positive potential is applied to first electrode 801a and a negative potential is applied to second electrode 801b. In some embodiments, with an applied voltage 'V' (or electric field 'E'), the magnetization 807 tends to point to hard-axis directions due to the combination of piezoelectric and magnetostrictive effects. At the same time, the exchange bias 806 guides the magnetization of MS material 804. Thus, the net magnetization in this stack points to the two-stable easy-axis directions with an applied voltage 'V', according to some embodiments. By controlling the polarity of voltage, the magnetization of FM layer 803 can be controlled, according to some embodiments.

Figure 8B:
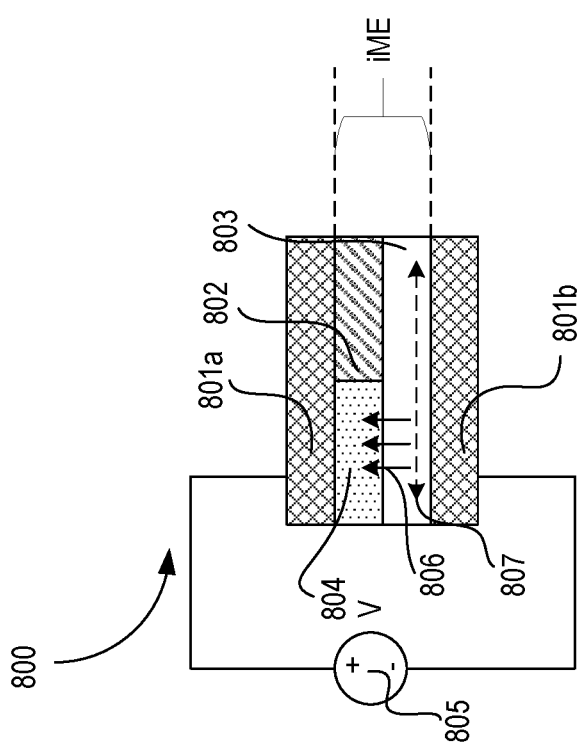
FIG. 8B illustrates a laminate structure with a deterministic MS stack with a negative voltage applied across it, according to some embodiments of the disclosure.

FIG. 8B illustrates laminate structure 820 with a deterministic MS stack with a negative voltage applied across it, according to some embodiments of the disclosure. It is pointed out that those elements of FIG. 8B having the same reference numbers (or names) as the elements of any other figure can operate or function in any manner similar to that described, but are not limited to such. Laminate structure 820 is similar to laminate structure 800 but for reverse in applied voltage 'V'. Here, voltage source 825 is coupled to laminate structure 820 such that a negative potential is applied to electrode 801a and a positive potential is applied to interconnect 801b. The magnetization induced by switched exchange bias 826 is opposite in polarity than the magnetization induced by previous exchange bias 806. As such, the net magnetization in this stack will point to the other of the two-stable easy-axis directions (compared to that of FIG. 8A) with an applied voltage 'V', according to some embodiments.

FIG. 9 illustrates memory bit cell 900 comprising a laminate structure with a deterministic MS stack, according to some embodiments of the disclosure. It is pointed out that those elements of FIG. 5 having the same reference numbers (or names) as the elements of any other figure can operate or function in any manner similar to that described, but are not limited to such.

Bit cell 900 comprises BL, SL, $WL_{read}$, $WL_{write}$, first n-type transistor MN1, second n-type transistor MN2, laminate structure with deterministic stack coupled to transistor MN2, transistor MN1, and SL. In some embodiments, BL is coupled to drain/source terminal of transistors MN1 and MN2. In some embodiments, source/drain terminal of transistor MN2 is coupled to first electrode 801a. Compared to laminate structure 800 of FIG. 8A, here FM layer 803 is extended as shown by FM layer 903.

Here, FM layer 903 has the same material composition as FM layer 303. In some embodiments, a second electrode 901a (e.g., formed of same material as electrode 301a) is formed adjacent to FM layer 903 such that second electrode 901a is coupled to source/drain of first transistor MN1. In some embodiments, a SOC material 904 is formed adjacent to FM layer 903. In some embodiments, third electrode 901b is formed adjacent to SOC 904 such that third electrode 901b is coupled to SL. Third electrode 901b may be formed of the same material as electrode 301a. In some embodiments, SOC material 904 comprises a material selected from a group consisting of: β-Ta, β-W, W, Pt, Cu doped with Iridium, Cu doped with Bismuth, and Cu doped an element of 3d, 4d, 5d, 4f, or 5f of periodic table groups.

In some embodiments, bit cell 900 is selected from among other bit cells in a memory array (not shown) by activating a particular BL and a word line (e.g., one of $WL_{read}$ or $WL_{write}$). The sequence of voltages applied to word lines and bit lines for read and write operations is the same as those described with reference to FIG. 5.

During read operation, the first transistor MN1 is turned on. As such transistor MN1 electrically couples to BL. Transistor MN1 is turned on by activating $WL_{read}$ (e.g., setting $WL_{read}$ to a logic '1'). During read operation, the second transistor MN2 is turned off. As such transistor MN2 electrically de-couples from BL. Transistor MN2 is turned off by de-activating $WL_{write}$ (i.e., setting $WL_{write}$ to a logic '0'). A read current is applied to FM layer 903 via the turned on transistor MN1 and through BL. In some embodiments, the read current is applied as a pulse having a pulse width and/or height. In some embodiments, SL is coupled to ground during read operation. The current passing through the ferromagnetic element 903 is spin polarized, in accordance with some embodiments. In some embodiments, spin polarized current exiting FM layer 903 is converted to charge current $I_{charge}$ due to the nature of transport across inverse spin orbit coupling (ISOC) layer 904. The charge current $I_{charge}$ is collected on SL. A sense amplifier (not shown) determines the state stored in the memory bit-cell according to the direction of the charge current $I_{charge}$. For example, if the direction of the charge current $I_{charge}$ is away from the bit-cell then the logic stored is logic '0,' otherwise the logic stored is logic '1.'

During write operation, the first transistor MN1 is turned off. As such transistor MN1 electrically de-couples from BL. Transistor MN1 is turned off by de-activating $WL_{read}$ (e.g., setting $WL_{read}$ to a logic '0'). During write operation, the second transistor MN2 is turned on. As such transistor MN2 electrically couples to BL. Transistor MN2 is turned on by activating $WL_{write}$ (e.g., setting $WL_{write}$ to a logic '1'). Voltage applied across layers 801a and 901b switches the magnetization in layer 903. In some embodiments, layer 802 modifies the magnetic anisotropy of layer 903 and causes it to deflect to +/−y axis. In some embodiments, layer 804 exerts exchange bias in +x or −x direction and sets a definite direction of magnetization in layer 903 after switching. In some embodiments, positive voltage at BL switches magnetization in layer 903 along the +x axis, and negative voltage at BL switches magnetization in layer 903 along the −x axis.

Figure 10:
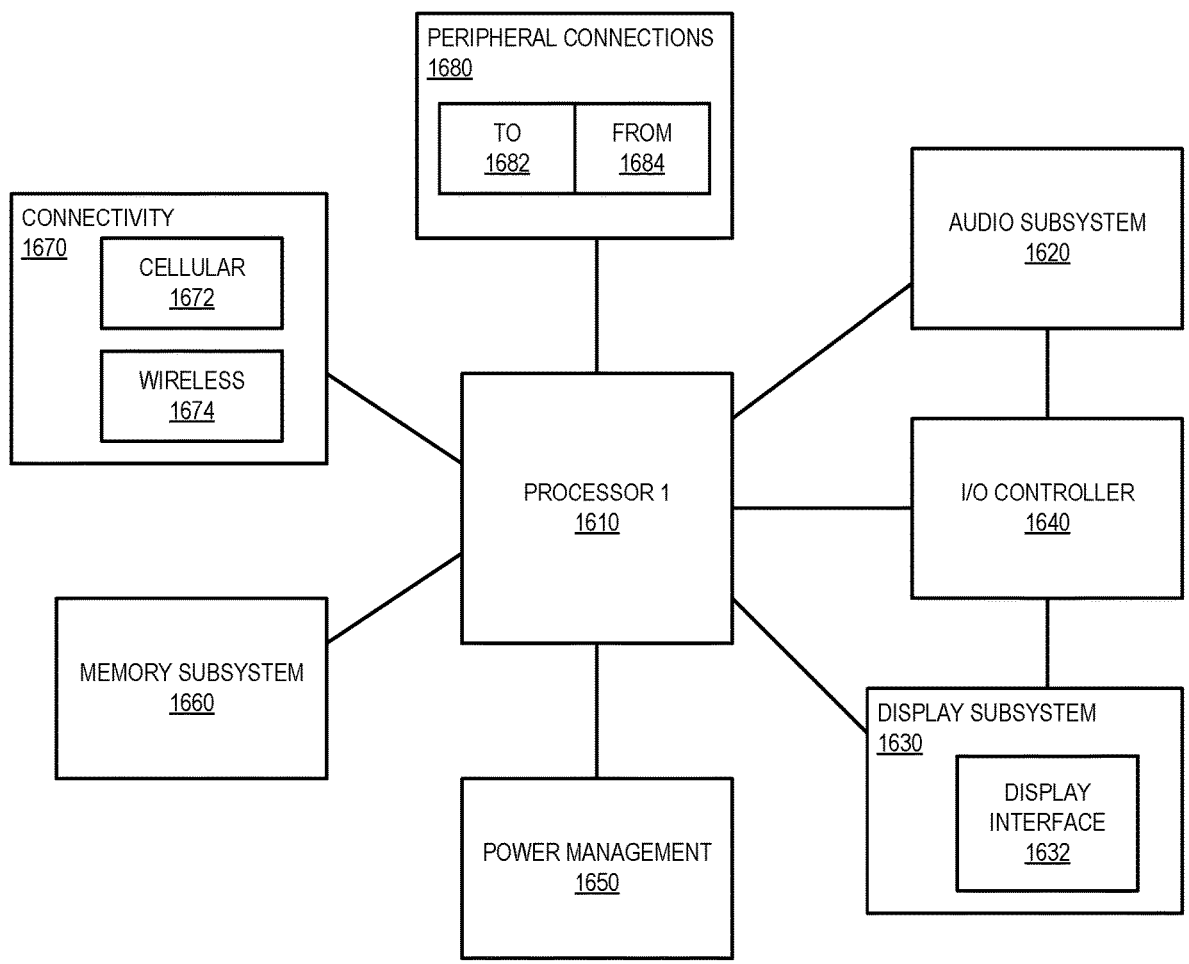
FIG. 10 illustrates a smart device or a computer system or a SoC (System-on-Chip) with a deterministic MS stack, according to some embodiments.

FIG. 10 illustrates a smart device or a computer system or a SoC (System-on-Chip) 1600 with a deterministic MS stack, according to some embodiments. It is pointed out that those elements of FIG. 10 having the same reference numbers (or names) as the elements of any other figure can operate or function in any manner similar to that described, but are not limited to such.

FIG. 10 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes first processor 1610 with a deterministic MS stack, according to some embodiments discussed. Other blocks of the computing device 1600 may also include a deterministic MS stack, according to some embodiments. The various embodiments of the present disclosure may also comprise a network interface within 1670 such as a wireless interface so that a system embodiment may be incorporated into a wireless device, for example, cell phone or personal digital assistant.

In some embodiments, processor 1610 can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

In some embodiments, computing device 1600 comprises display subsystem 1630. Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

In some embodiments, computing device 1600 comprises I/O controller 1640. I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises connectivity 1670. Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

In some embodiments, computing device 1600 comprises peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus which provided which comprises: a ferromagnetic (FM) region with magnetostrictive (MS) property; a piezo-electric (PZe) region adjacent to the FM region; and a magnetoelectric region adjacent to the FM region. In some embodiments, the FM region comprises a material selected from a group consisting of: Terfenol-D ($Tb_xDy_{1-x}Fe_2$); $Fe_{1-x}Ga_x$; CoFe; Fo; $CoFe_2O_4$; $CoFeO_3$; CoPd; CoFeB; $NiFe_2O_4$; and FeRh. In some embodiments, the magnetoelectric region comprises a material selected from a group consisting of: $BiFeO_3$ and $Cr_2O_3$. In some embodiments, the PZe region comprises a material selected from a group consisting of: $Pb(Zr_{0.2} Ti_{0.8})O_3$; $PbTiO_3$; $BaTiO_3$; $BiFeO_3$; $Bi_4Ti_3O_{12}$; Polyvinylidene fluoride; PZT; and PMNPT. In some embodiments, the apparatus comprises a first metal layer adjacent to the magnetoelectric region. In some embodiments, the apparatus comprises a second metal layer adjacent to the FM region, and the PZe region.

In some embodiments, the apparatus comprises a voltage source coupled to the first and second metal layers. In some embodiments, the apparatus comprises a first transistor coupled to the first metal layer, wherein the first transistor has a gate terminal controllable by a write wordline ($WL_{write}$). In some embodiments, the apparatus comprises: a second metal layer adjacent to the FM region; a spin orbit coupling (SOC) region adjacent to the FM region; and a third metal layer adjacent to the SOC region. In some embodiments, the apparatus 9 comprises a second transistor coupled to the first transistor and the second metal layer, wherein the second transistor has a gate terminal which is controllable by a read wordline ($WL_{read}$). In some embodiments, the first and second transistors are coupled to a bit-line. In some embodiments, the third metal layer is coupled to a source line. In some embodiments, the SOC region comprises a material selected from a group consisting of: β-Ta, β-W, W, Pt, Cu doped with Iridium, Cu doped with Bismuth, and Cu doped an element of 3d, 4d, 5d, 4f, or 5f of periodic table groups.

In another example, an apparatus is provided which comprises: a ferromagnetic (FM) region with magnetostrictive (MS) property; a piezo-electric (PZe) region adjacent to the FM region; and a magnetoelectric region, wherein the FM region is at least partially adjacent to the magnetoelectric region. In some embodiments, the FM region comprises a material selected from a group consisting of: Terfenol-D ($Tb_xDy_{1-x}Fe_2$); $Fe_{1-x}Ga_x$; CoFe; Co; $CoFe_2O_4$; $CoFeO_3$; CoPd; CoFeB; $NiFe_2O_4$; and FeRh. In some embodiments, the magnetoelectric region comprises a material selected from a group consisting of: $BiFeO_3$ and $Cr_2O_3$. In some embodiments, the PZe region comprises a material selected from a group consisting of: $Pb(Zr_{0.2} Ti_{0.8})O_3$; $PbTiO_3$; $BaTiO_3$; $BiFeO_3$; $Bi_4Ti_3O_{12}$; Polyvinylidene fluoride; PZT; and PMNPT. In some embodiments, the apparatus comprises a first electrode adjacent to the magnetoelectric region. In some embodiments, the apparatus comprises a second electrode adjacent to the PZe region. In some embodiments, the apparatus comprises a voltage source coupled to the first and second electrodes.

In another example, a system is provided which comprises: a memory; a processor coupled to the memory, wherein the processor includes an apparatus according to the apparatus described above; and a wireless interface for allowing the processor to communicate with another device.

In another example, an apparatus is provided which comprises: a FM region with MS property; a (PZe region adjacent to the FM region; a magnetoelectric region being adjacent to the FM and PZe regions; a first electrode adjacent to the FM and PZe regions; a second electrode adjacent to the magnetoelectric region; a SOC region adjacent to the magnetoelectric region; and a third electrode adjacent to the SOC region. In some embodiments, the apparatus comprises a first transistor coupled to the first electrode, wherein the first transistor has a gate terminal controllable by $WL_{write}$. In some embodiments, the apparatus comprises a second transistor coupled to the second electrode and to the first transistor, wherein the second transistor is controllable by $WL_{read}$. In some embodiments, the apparatus comprises a bit-line coupled to the first and second transistors.

In some embodiments, the apparatus comprises a source line coupled to the third electrode. In some embodiments, the first FM region comprises a material selected from a group consisting of: Terfenol-D ($Tb_xDy_{1-x}Fe_2$); $Fe_{1-x}Ga_x$; CoFe; Co; $CoFe_2O_4$; $CoFeO_3$; CoPd; CoFeB; $NiFe_2O_4$; and FeRh. In some embodiments, the magnetoelectric region comprises a material selected from a group consisting of: $BiFeO_3$ and $Cr_2O_3$. In some embodiments, the PZe region comprises a material selected from a group consisting of: $Pb(Zr_{0.2} Ti_{0.8})O_3$; $PbTiO_3$; $BaTiO_3$; $BiFeO_3$; $Bi_4Ti_3O_{12}$; Polyvinylidene fluoride; PZT; and PMNPT. In some embodiments, the SOC region comprises a material selected from a group consisting of: β-Ta, β-W, W, Pt, Cu doped with Iridium, Cu doped with Bismuth, and Cu doped an element of 3d, 4d, 5d, 4f, or 5f of periodic table groups.

In another example, a system is provided which comprises: a memory; a processor coupled to the memory, wherein the processor includes an apparatus according to the apparatus described above; and a wireless interface for allowing the processor to communicate with another device.

In another example, a method is provided which comprises: forming a FM region with MS property; forming a PZe region adjacent to the FM region; and forming a magnetoelectric region adjacent to the FM region. In some embodiments, the FM region comprises a material selected from a group consisting of: Terfenol-D ($Tb_xDy_{1-x}Fe_2$); $Fe_{1-x}Ga_x$; CoFe; Fo; $CoFe_2O_4$; $CoFeO_3$; CoPd; CoFeB; $NiFe_2O_4$; and FeRh. In some embodiments, the magnetoelectric region comprises a material selected from a group consisting of: $BiFeO_3$ and $Cr_2O_3$. In some embodiments, the PZe region comprises a material selected from a group consisting of: $Pb(Zr_{0.2} Ti_{0.8})O_3$; $PbTiO_3$; $BaTiO_3$; $BiFeO_3$; $Bi_4Ti_3O_{12}$; Polyvinylidene fluoride; PZT; and PMNPT. In some embodiments, the method comprises depositing a first metal layer adjacent to the magnetoelectric region. In some embodiments, the method comprises depositing a second metal layer adjacent to the FM region, and the PZe region. In some embodiments, the method comprises coupling a voltage source to the first and second metal layers.

In some embodiments, the method comprises forming a first transistor which is coupled to the first metal layer, wherein the first transistor has a gate terminal controllable by $WL_{write}$. In some embodiments, the method comprises: forming a second metal layer adjacent to the FM region; forming a SOC region adjacent to the FM region; and forming a third metal layer adjacent to the SOC region. In some embodiments, the method comprises forming a second transistor which coupled to the first transistor and the second metal layer, wherein the second transistor has a gate terminal which is controllable by $WL_{read}$. In some embodiments, the method comprises coupling the first and second transistors to a bit-line. In some embodiments, the method comprises coupling the third metal layer to a source line. In some embodiments, the SOC region comprises a material selected from a group consisting of: β-Ta, β-W, W, Pt, Cu doped with Iridium, Cu doped with Bismuth, and Cu doped an element of 3d, 4d, 5d, 4f, or 5f of periodic table groups.

In another example, an apparatus is provided which comprises: FM means with MS property; PZe means adjacent to the FM means; and magnetoelectric means, wherein the FM means is at least partially adjacent to the magnetoelectric means. In some embodiments, the FM means comprises a material selected from a group consisting of: Terfenol-D ($Tb_xDy_{1-x}Fe_2$); $Fe_{1-x}Ga_x$; CoFe; Co; $CoFe_2O_4$; $CoFeO_3$; CoPd; CoFeB; $NiFe_2O_4$; and FeRh. In some embodiments, the magnetoelectric means comprise a material selected from a group consisting of: $BiFeO_3$ and $Cr_2O_3$. In some embodiments, the PZe means comprise a material selected from a group consisting of: $Pb(Zr_{0.2}Ti_{0.8})O_3$; $PbTiO_3$; $BaTiO_3$; $BiFeO_3$; $Bi_4Ti_3O_{12}$; Polyvinylidene fluoride; PZT; and PMNPT. In some embodiments, the apparatus comprises a first electrode means adjacent to the magnetoelectric means. In some embodiments, the apparatus comprises a second electrode means adjacent to the PZe means. In some embodiments, the apparatus comprises means for providing voltage to the first and second electrodes.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
a ferromagnetic (FM) region with magnetostrictive (MS) property;
a first piezo-electric (PZe) region directly adjacent to a first side of the FM region;
a second PZe region directly adjacent to a second side of the FM region, wherein the second side is opposite of the first side; and
a magnetoelectric region adjacent to the FM region, the first PZe region and the second PZe region,
wherein the first and second PZe regions have a length in a first direction substantially same as a length of the FM region in the first direction.

2. The apparatus of claim 1, wherein the FM region comprises a material including one of: Terfenol-D ($Tb_xDy_{1-x}Fe_2$); $Fe_{1-x}Ga_x$; CoFe; Co; $CoFe_2O_4$; $CoFeO_3$; CoPd; CoFeB; $NiFe_2O_4$; or FeRh.

3. The apparatus of claim 1, wherein the magnetoelectric region comprises a material including one of: $BiFeO_3$ or $Cr_2O_3$.

4. The apparatus of claim 1, wherein the first or second PZe region comprises a material including one of: $Pb(Zr_{0.2}Ti_{0.8})O_3$; $PbTiO_3$; $BaTiO_3$; $BiFeO_3$; $Bi_4Ti_3O_{12}$; Polyvinylidene fluoride; PZT; or PMNPT.

5. The apparatus of claim 1 comprises a first metal layer adjacent to the magnetoelectric region.

6. The apparatus of claim 5 comprises a second metal layer adjacent to the FM region, the first PZe region, and the second PZe region.

7. The apparatus of claim 6 comprises a voltage source coupled to the first and second metal layers.

8. The apparatus of claim 5 comprises a first transistor coupled to the first metal layer, wherein the first transistor has a gate terminal controllable by a write wordline ($WL_{write}$).

9. An apparatus comprising:
a ferromagnetic (FM) region with magnetostrictive (MS) property;
a first piezo-electric (PZe) region adjacent to the FM region;
a second PZe region adjacent to the FM region such that the FM region is between the first PZe region and the second PZe region;
a magnetoelectric region, wherein the FM region is at least partially adjacent to the magnetoelectric region, wherein the first PZe region is at least partially adjacent to the magnetoelectric region, and wherein the second PZe region is at least partially adjacent to the magnetoelectric region, wherein the magnetoelectric region is on top or on bottom of the FM region, the first PZe region and the second PZe region.

10. The apparatus of claim 9, wherein the FM region comprises a material including one of: Terfenol-D ($Tb_xDy_{1-x}Fe_2$); $Fe_{1-x}Ga_x$; CoFe; Co; $CoFe_2O_4$; $CoFeO_3$; CoPd; CoFeB; $NiFe_2O_4$; or FeRh.

11. The apparatus of claim 9, wherein the magnetoelectric region comprises a material including one of: $BiFeO_3$ or $Cr_2O_3$.

12. The apparatus of claim 9, wherein the first or second PZe region comprises a material including one of: $Pb(Zr_{0.2}Ti_{0.8})O_3$; $PbTiO_3$; $BaTiO_3$; $BiFeO_3$; $Bi_4Ti_3O_{12}$; Polyvinylidene fluoride; PZT; or PMNPT.

13. The apparatus of claim 9 comprises a first electrode adjacent to the magnetoelectric region.

14. The apparatus of claim 13 comprises a second electrode adjacent to the PZe region.

15. The apparatus of claim 14 comprises a voltage source coupled to the first and second electrodes.

16. The apparatus of claim 1, wherein the FM region comprises a material including one of: Tb, Dy, Fe, Ga, Co, Pd, B, Ni, and/or Rh.

17. The apparatus of claim 1, wherein the magnetoelectric region comprises a material including one of: Bi, Fe, and/or Cr.

18. The apparatus of claim 1, wherein the first or second PZe region comprises a material including one of: Pb, Zr, Ti, Ba, Fe, F, C, H, Mg, and/or Nb.

19. The apparatus of claim 1, wherein the first and second PZe regions have a width in a second direction substantially smaller than the length of the FM region in the first direction, wherein the first direction is orthogonal to the second direction.

20. The apparatus of claim 1, wherein the magnetoelectric region is on top or on bottom of the FM region, the first PZe region and the second PZe region.

\* \* \* \* \*